US012538056B2

(12) United States Patent
Deng

(10) Patent No.: US 12,538,056 B2
(45) Date of Patent: Jan. 27, 2026

(54) DETACHABLE LOUDSPEAKER AND METAL DETECTOR

(71) Applicant: Maoquan Deng, Shenzhen (CN)

(72) Inventor: Maoquan Deng, Shenzhen (CN)

( * ) Notice: Subject to any disclaimer, the term of this patent is extended or adjusted under 35 U.S.C. 154(b) by 92 days.

(21) Appl. No.: 18/434,722

(22) Filed: Feb. 6, 2024

(65) Prior Publication Data

US 2024/0292138 A1 Aug. 29, 2024

Related U.S. Application Data

(60) Provisional application No. 63/448,375, filed on Feb. 27, 2023.

(51) Int. Cl.
*H04R 1/02* (2006.01)
*H04R 1/18* (2006.01)
*H04R 1/44* (2006.01)
*H05K 1/18* (2006.01)

(52) U.S. Cl.
CPC ............ *H04R 1/025* (2013.01); *H04R 1/026* (2013.01); *H04R 1/028* (2013.01); *H04R 1/44* (2013.01); *H05K 1/18* (2013.01)

(58) Field of Classification Search
CPC .......... H04R 1/025; H04R 1/026; H04R 1/02; H04R 1/028; H05K 1/18
USPC .................................. 381/386, 87, 150, 332
See application file for complete search history.

(56) References Cited

U.S. PATENT DOCUMENTS 9,161,111 B2 * 10/2015 Yuan .................. F21V 33/0056

* cited by examiner

*Primary Examiner* — Thjuan K Addy

(57) ABSTRACT

A detachable loudspeaker and metal detector includes a loudspeaker assembly detachably installed outside a control box. The loudspeaker assembly includes an outer protective shell, an inner protective shell, and a dynamic loudspeaker. The outer and inner protective shells form an accommodating cavity in which the dynamic loudspeaker is installed. The inner protective shell is facing the control box, which is equipped with a PCB board. The dynamic loudspeaker is electrically connected to the PCB board through terminal wires. A detachable component is arranged on the outer protective shell to detachably fix the outer protective shell to the control box. When the loudspeaker assembly is damaged and needs to be replaced, it can be detached from the control box without opening the control box, which greatly improves the inconvenience of replacing the loudspeaker assembly.

18 Claims, 5 Drawing Sheets

DETACHABLE LOUDSPEAKER AND METAL DETECTOR

CROSS REFERENCE TOLERATED APPLICATIONS

This application claims priority to U.S. Provisional Application No. U.S. 63/448,375, entitled "REMOVABLE SPEAKER MODULE" filed on Feb. 27, 2023, which is hereby incorporated by reference herein as if set forth in its entirety.

TECHNICAL FIELD

This application belongs to the field of metal detection technology, specifically a detachable loudspeaker and metal detector.

BACKGROUND OF THE APPLICATION

Loudspeakers installed on metal detector devices can sound to inform users of real-time detection information. To meet requirements of more usage environments, modern metal detectors need to be waterproof. Manufacturers use dynamic loudspeakers to make the metal detectors produce sufficiently loud volumes. As the most important alarm component in the detector, the sound emission structure of the loudspeaker is precise and fragile.

Referring to FIG. 1, the loudspeakers in most metal detectors are installed inside the control box 1. A PCB board 10 is installed inside the control box 1. The side wall of the control box 1 facing the PCB board 10 is convexly formed into an arc-shaped side wall. A dynamic loudspeaker 23 is installed on the arc-shaped side wall of the control box 1. Waterproof adhesive 22 is coated between the dynamic loudspeaker 23 and the arc-shaped side wall of the control box 1. A plurality of through holes 200 are opened in the arc-shaped side wall of the control box 1 and face the dynamic loudspeaker 23. The dynamic loudspeaker 23 includes a fixing bracket 230, a vibration diaphragm 231, a copper coil 232, a magnet 233 and two terminal wires 234 connected to the PCB board 10.

For the related art described above, under harsh usage environments such as excessive water pressure or external blunt impact, the vibration diaphragm of the loudspeaker can be damaged, causing the loudspeaker to fail and need replacement. However, existing loudspeakers cannot be detached separately and require the entire control box to be disassembled, making replacement extremely inconvenient.

DESCRIPTION OF THE APPLICATION

In order to solve the problems in the background art, the application provides a detachable loudspeaker and metal detector, wherein the loudspeaker assembly can be detachably fixed to the control box via a detachable component. When the loudspeaker assembly is damaged and needs to be replaced, it can be detached from the control box without opening the control box, which greatly improves the inconvenience of replacing the loudspeaker assembly.

The first objective of the application is to provide a detachable loudspeaker installed outside a control box, comprising: a loudspeaker assembly including an outer protective shell, an inner protective shell, and a dynamic loudspeaker, wherein the outer protective shell and the inner protective shell form an accommodating cavity, the dynamic loudspeaker is installed in the accommodating cavity, the inner protective shell faces the control box; a PCB board installed inside the control box; terminal wires connecting the dynamic loudspeaker to the PCB board; and a detachable component disposed on the outer protective shell and contacting the control box to detachably fix the outer protective shell to the control box.

By adopting the above technical solution, the loudspeaker assembly is detachably installed on the control box via the detachable component. Therefore, when the loudspeaker assembly is damaged and needs to be replaced, the loudspeaker assembly can be detached separately without opening the control box, which greatly improves the inconvenience of replacing the loudspeaker assembly.

Optionally, the detachable component comprises a clamping edge set on the outer protective shell, with multiple screws running through the circumference of the clamping edge. The side wall of the control box near the inner protective shell is recessed inward to form multiple first mounting grooves, which are set one-to-one with multiple screws. Each first mounting groove is equipped with built-in nuts, and the screw threads are connected to the built-in nuts.

By adopting the above technical solution, when replacing the loudspeaker assembly, unscrewing the screws from the built-in nuts can remove the loudspeaker assembly. When installing a new loudspeaker assembly, screwing the screws into the built-in nuts can install the loudspeaker assembly. The replacement process is simple and convenient.

Optionally, the detachable component comprises a clamping edge fixed to the outer protective shell, a retaining plate disposed on the outer wall of the control box to retain a portion of the clamping edge, and screws fixing another portion of the clamping edge to the control box.

By adopting the above technical solution, when replacing the loudspeaker assembly, unscrewing the screws from the built-in nuts and then removing the clamping edge from between the retaining plate and control box can remove the loudspeaker assembly. When installing a new loudspeaker assembly, inserting the clamping edge between the retaining plate and control box first, then screwing the screws into the built-in nuts can install the loudspeaker assembly. The setting of the retaining plate reduces the number of screws, thereby reducing the number of times to screw the screws and improving the installation speed.

Optionally, the detachable component comprises a clamping edge disposed on the outer protective shell, a limiting ring disposed on the outer wall of the control box near the clamping edge, the clamping edge retained in the limiting ring, threads disposed on the outer peripheral wall of the limiting ring, threads also disposed on the inner peripheral wall of the locking ring, the locking ring threadedly connected to the limiting ring, and the locking ring pressing the clamping edge.

By adopting the above technical solution, when replacing the loudspeaker assembly, unscrewing the locking ring from the limiting ring and then taking out the clamping edge from the limiting ring can remove the loudspeaker assembly. When installing a new loudspeaker assembly, retaining the clamping edge in the limiting ring first, then screwing the locking ring to thread it onto the limiting ring and press the clamping edge in place, no tools are required to replace the loudspeaker assembly, which further improves the convenience of replacing the loudspeaker assembly.

Optionally, a connecting component is disposed between the terminal wires and the PCB board, the connecting component comprises a second mounting groove formed by the inner protective shell recessing inward, two spring pins disposed at the bottom of the second mounting groove, the two terminal wires respectively electrically connected to the two spring pins, a third mounting groove formed in the side wall of the control box near the inner protective shell, the third mounting groove disposed corresponding to the second mounting groove, two metal contacts disposed at the bottom of the third mounting groove, the two spring pins respectively abutting against the two metal contacts, each metal contact connected with a connecting wire, the two connecting wires electrically connected to the PCB board.

By adopting the above technical solution, when installing the loudspeaker assembly, the spring pins abut against the metal contacts to connect the terminal wires to the PCB board. After removing the loudspeaker assembly, the spring pins and metal contacts are automatically separated, which facilitates replacement of the loudspeaker assembly.

Optionally, a connecting component is disposed between the terminal wires and the PCB board, the connecting component comprises a second mounting groove formed by the inner protective shell recessing inward, a third mounting groove formed in the side wall of the control box near the inner protective shell, the third mounting groove disposed corresponding to the second mounting groove, two metal contacts disposed at the bottom of the third mounting groove, each metal contact connected with a connecting wire, the two connecting wires electrically connected to the PCB board, the two terminal wires penetrate the inner protective shell and extend out from the second mounting groove, the two terminal wires respectively welded to the two metal contacts.

By adopting the above technical solution, before installing the loudspeaker assembly, the terminal wires need to be welded to the metal contacts first, which greatly improves the connection reliability between the terminal wires and the metal contacts.

Optionally, the inner protective shell has an annular first receiving groove recessed inward surrounding the second mounting groove, an annular waterproof ring disposed on the groove wall of the first receiving groove, the waterproof ring abutting against the outer wall of the control box.

By adopting the above technical solution, the waterproof ring can seal the gap between the inner protective shell and the control box to prevent water from entering the third mounting groove and contacting the metal contacts.

Optionally, the inner protective shell has a second receiving groove recessed inward, a balancing hole opened in the bottom of the second receiving groove, a waterproof sound-transmitting membrane disposed on the bottom of the second receiving groove and covering the balancing hole.

By adopting the above technical solution, the waterproof sound-transmitting membrane is used to balance the acoustic cavity pressure between the dynamic loudspeaker and the inner protective shell.

Optionally, waterproof adhesive is coated between the outer protective shell and the inner protective shell, and between the dynamic loudspeaker and the outer protective shell.

By adopting the above technical solution, on the one hand, the waterproof adhesive can connect the outer protective shell to the inner protective shell and the dynamic loudspeaker. On the other hand, it also has a sealing waterproof effect.

The second objective of the application is to provide a metal detector comprising the detachable loudspeaker according to any one of the above, the control box fixed on the metal detector.

By adopting the above technical solution, the metal detector is provided with a detachable loudspeaker to improve the inconvenience of replacing the loudspeaker on the metal detector.

The beneficial effects of the application are:

(1) The loudspeaker assembly is detachably installed on the control box via the detachable component, so that when the loudspeaker assembly is damaged and needs to be replaced, the loudspeaker assembly can be detached separately without opening the control box, which greatly improves the inconvenience of replacing the loudspeaker assembly.

(2) When replacing the loudspeaker assembly, unscrewing the screws from the built-in nuts can remove the loudspeaker assembly. When installing a new loudspeaker assembly, screwing the screws into the built-in nuts can install the loudspeaker assembly. The replacement process is simple and convenient.

(3) When installing the loudspeaker assembly, the spring pins abut against the metal contacts to connect the terminal wires to the PCB board. After removing the loudspeaker assembly, the spring pins and metal contacts are automatically separated, which facilitates replacement of the loudspeaker assembly.

BRIEF DESCRIPTION OF THE DRAWINGS

To further clarify the implementation of this utility model or the technical solutions in existing technology, a brief introduction to the drawings needed for describing the embodiments or existing technology follows. Obviously, the drawings described below represent only some embodiments of this utility model. For those skilled in the art, other drawings can be obtained without creative effort based on these drawings.

LIST OF REFERENCES AND FIGURES

1—control box, 10—PCB board;

2—loudspeaker assembly, 20—outer protective shell, 200—through hole, 21—inner protective shell, 22—waterproof adhesive, 23—dynamic loudspeaker, 230—fixing bracket, 231—vibrating diaphragm, 232—copper coil, 233—magnet, 234—terminal wire;

3—detachable component, 30—clamping edge, 31—screw, 32—first mounting groove, 33—built-in nut, 34—retaining plate, 35—limiting ring, 36—locking ring;

4—connecting component, 40—second mounting groove, 41—spring pin, 42—third mounting groove, 43—metal contact, 44—connecting wire;

5—first receiving groove, 50—waterproof ring;

6—second receiving groove, 60—balance hole, 61—waterproof sound-transmitting membrane.

PREFERRED EMBODIMENT OF THE APPLICATION

The following will describe the technical solutions in the embodiments of the application with reference to the accompanying drawings. Apparently, the embodiments described are only part of the embodiments of the application, not all embodiments. All other embodiments obtained by those ordinary skilled in the art without creative efforts based on the embodiments of the application shall also fall within the scope of protection of the application.

The following will describe the application in detail with reference to FIGS. 2-5 and specific embodiments.

Embodiment 1

Figure 1:
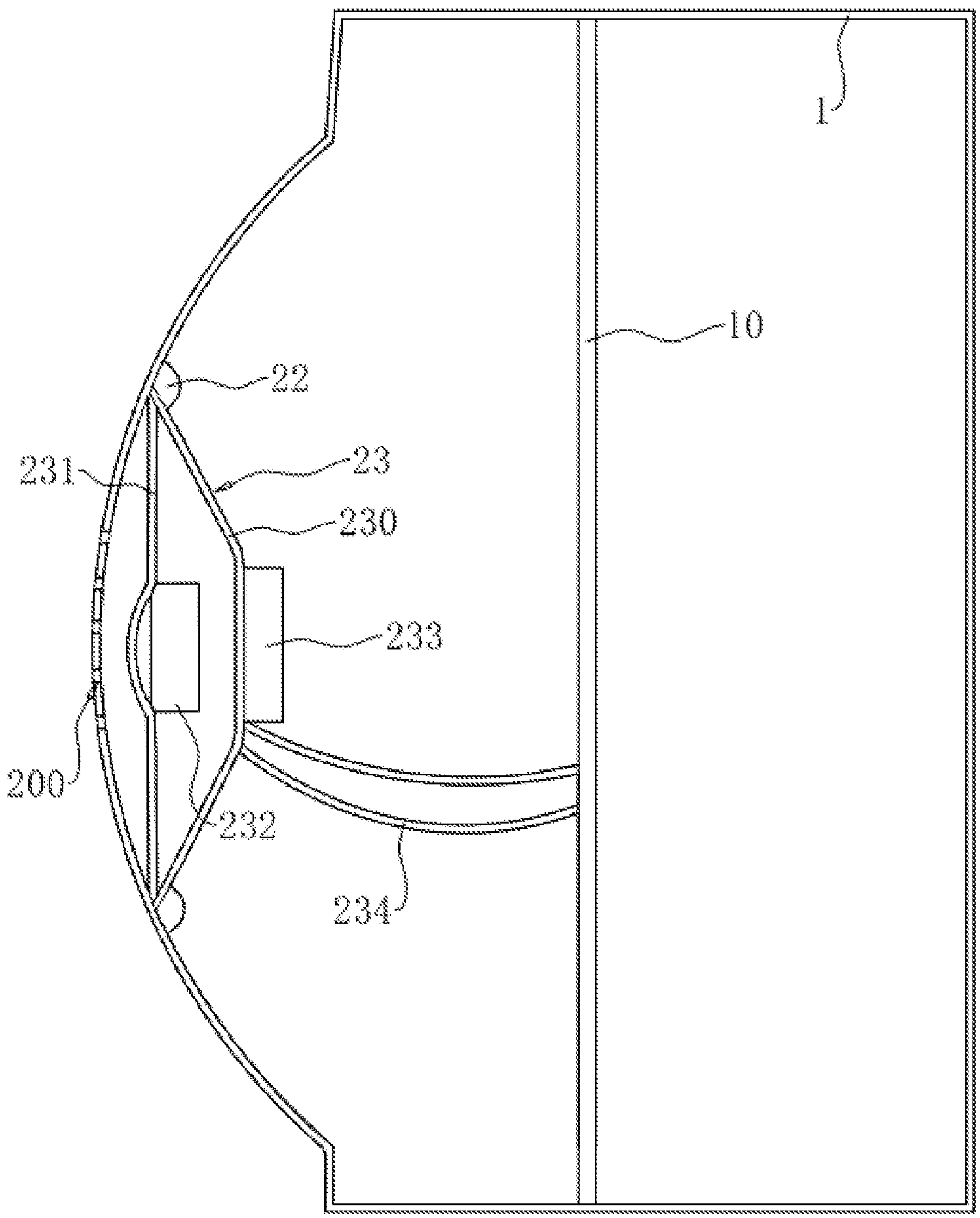
FIG. 1 shows a loudspeaker structure in prior art.
Figure 2:
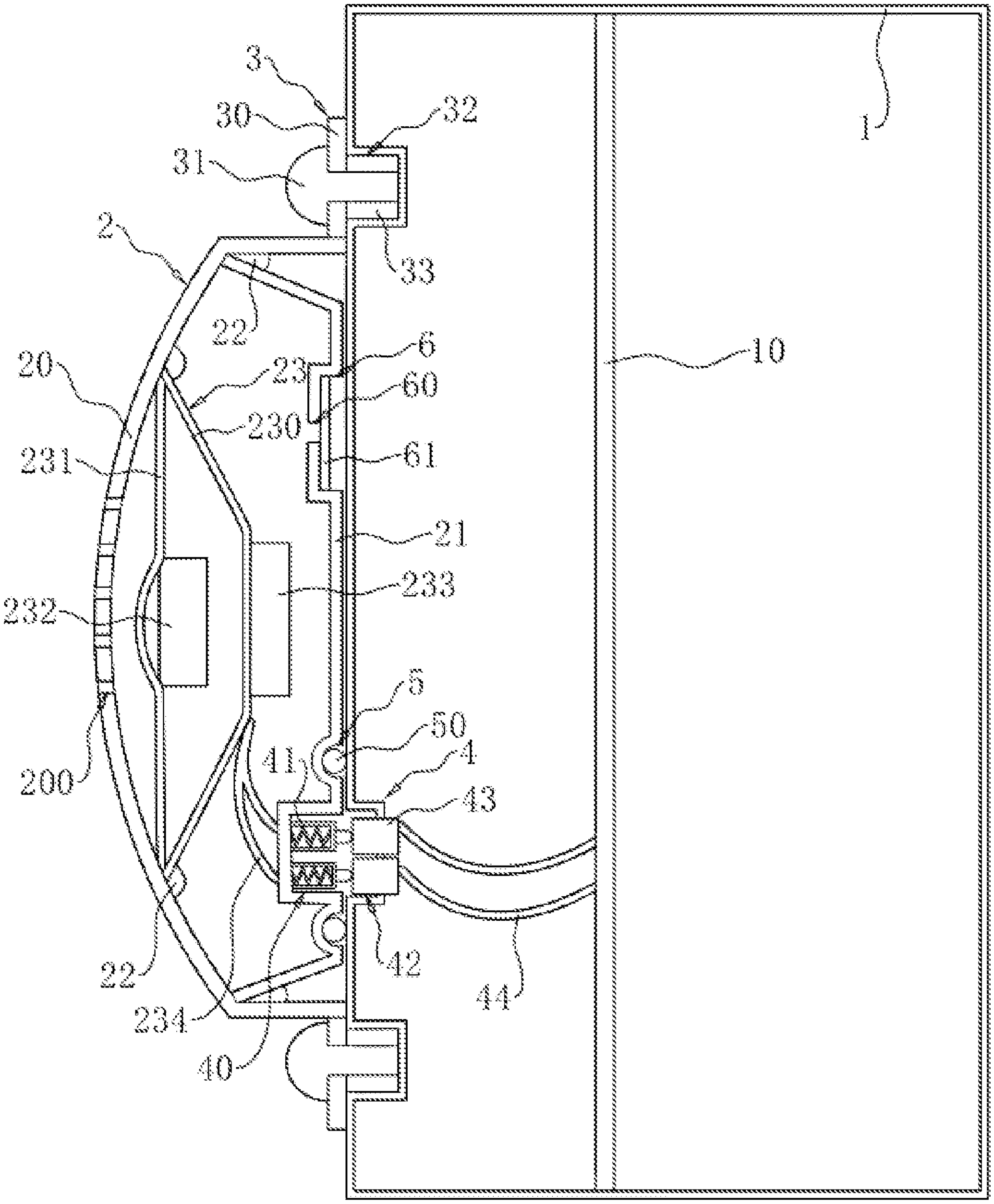
FIG. 2 shows a detachable loudspeaker structure per Embodiment 1.

Referring to FIG. 2, a detachable loudspeaker is installed outside of a control box 1 and includes a loudspeaker assembly 2. The loudspeaker assembly 2 includes an outer protective shell 20 and an inner protective shell 21. The outer protective shell 20 is located on the side of the inner protective shell 21 away from the control box 1. The outer protective shell 20 and the inner protective shell 21 form an accommodating cavity between them. A layer of waterproof adhesive 22 is coated between the outer protective shell 20 and the inner protective shell 21. On one hand, the waterproof adhesive 22 connects the outer protective shell 20 and the inner protective shell 21, on the other hand, it also has a sealing waterproof effect.

A dynamic loudspeaker 23 is fixedly connected to the outer protective shell 20 and is located in the accommodating cavity. A layer of waterproof adhesive 22 is also coated between the dynamic loudspeaker 23 and the outer protective shell 20. A plurality of through holes 200 are provided in the outer protective shell 20 opposite to the dynamic loudspeaker 23 to transmit the sound emitted by the dynamic loudspeaker 23.

The dynamic loudspeaker 23 includes a fixing bracket 230 fixedly connected on the outer protective shell 20. A vibration diaphragm 231 is fixedly connected to the side of the fixing bracket 230 close to the outer protective shell 20, opposite to the plurality of through holes 200. A copper coil 232 is fixedly connected on the vibration diaphragm 231, located between the vibration diaphragm 231 and the fixing bracket 230. A magnet 233 is fixedly connected to the side of the fixing bracket 230 away from the vibration diaphragm 231. Two terminal wires 234 are respectively connected to both ends of the copper coil 232.

A detachable component 3 contacting the control box 1 is disposed on the outer protective shell 20. The detachable component 3 includes an annular clamping edge 30 fixedly connected on the outer side wall of the outer protective shell 20 and surrounding the outer protective shell 20. A plurality of screws 31 penetrate vertically in the clamping edge 30 and are evenly arranged around the outer protective shell 20. A plurality of first mounting grooves 32 are formed on the side wall of the control box 1 near the loudspeaker assembly 2 corresponding one-to-one to the plurality of screws 31. Each first mounting groove 32 has a built-in nut 33 fixed inside, and the screw 31 is threadedly connected to the built-in nut 33, thereby detachably mounting the loudspeaker assembly 2 to the control box 1.

A PCB board 10 is installed inside the control box 1. A connecting component 4 is disposed between the terminal wires 234 and the PCB board 10, which includes a second mounting groove 40 formed by the inner protective shell 21 recessing inward. Two spring pins 41 are fixedly connected at the bottom of the second mounting groove 40. Two terminal wires 234 pass through the second mounting groove 40 and electrically connect to the two spring pins 41 respectively. A third mounting groove 42 is formed in the side wall of the control box 1 near the inner protective shell 21 opposite to the second mounting groove 40. Two metal contacts 43 are fixedly connected to the bottom surface of the third mounting groove 42. The two spring pins 41 abut against the two metal contacts 43 respectively. Each metal contact 43 is connected to a connecting wire 44, and two connecting wires 44 electrically connect to the PCB board 10, thereby connecting the dynamic loudspeaker 23 to the PCB board 10.

The inner protective shell 21 is concave inward to form a first receiving groove 5 with a circular shape. The first receiving groove 5 is arranged around the second mounting groove 40, and a circular waterproof ring 50 is fixedly connected to the groove wall of the first receiving groove 5. The waterproof ring 50 is pressed against the outer wall of the control box 1, thereby sealing the gap between the inner protective shell 21 and the control box 1, preventing water from entering the third mounting groove 42 and contacting the metal contact 43; The inner protective shell 21 is inwardly recessed and forms a second receiving groove 6. A balance hole 60 is opened at the bottom of the second receiving groove 6, and a waterproof sound-transmitting membrane 61 is fixedly connected to the bottom of the second receiving groove 6. The waterproof and transparent film 61 covers the balance hole 60. The waterproof sound-transmitting membrane 61 is used to maintain the air pressure balance of the sound chamber between the dynamic loudspeaker 23 and the inner protective shell 21.

The operating principle of Embodiment 1 is: When the loudspeaker assembly 2 is damaged and needs to be replaced, the staff only needs to screw the screws 31 to separate them from the built-in nuts 33 so that the loudspeaker assembly 2 can be removed for replacement. When installing a new loudspeaker assembly 2, first make the spring pins 41 abut against the metal contacts 43, then screw the screws 31 into the built-in nuts 33 to install the loudspeaker assembly 2 on the control box 1. The replacement of the loudspeaker assembly 2 is simple and convenient, which greatly improves the inconvenience of replacing the loudspeaker assembly 2.

Embodiment 2

Figure 3:
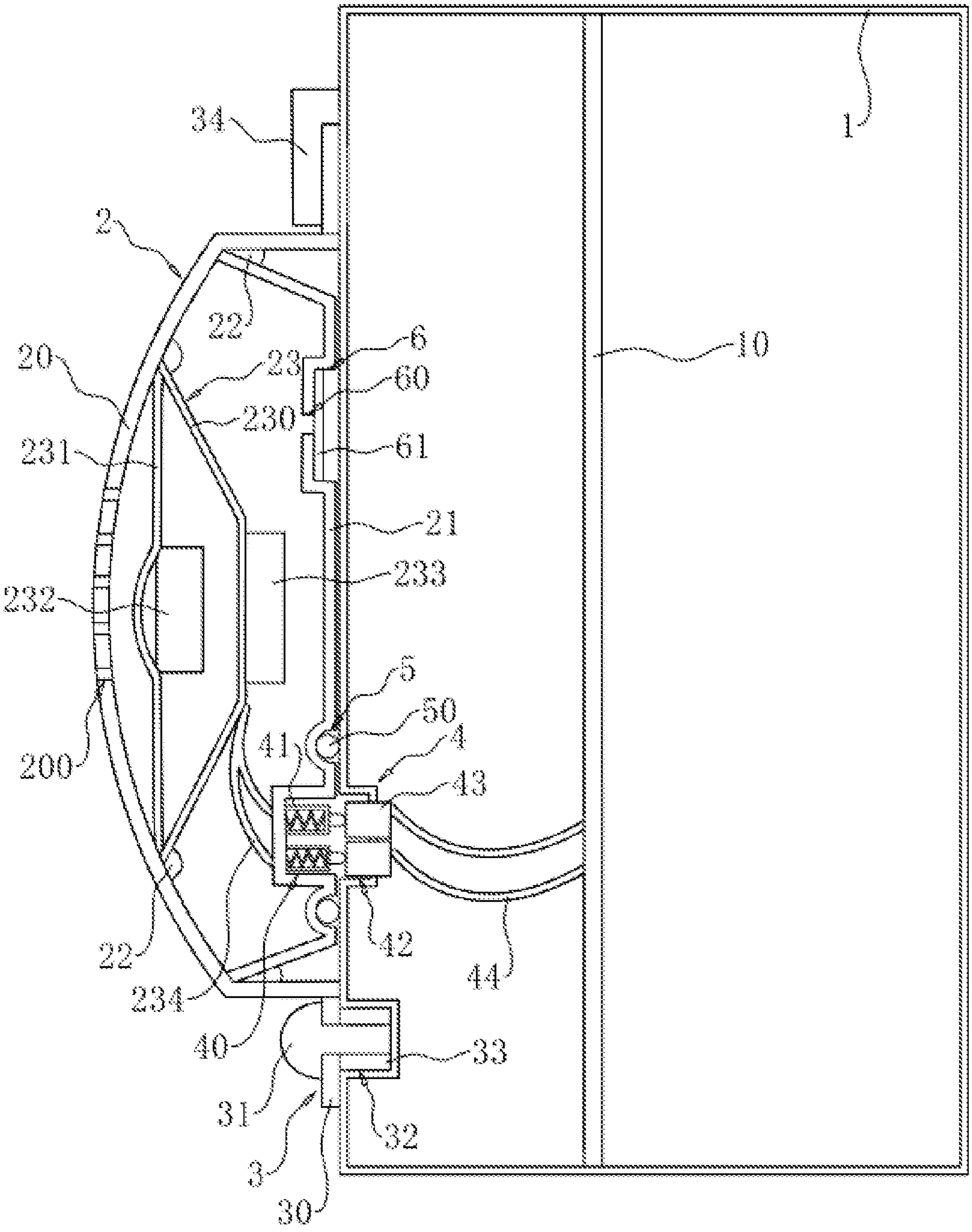
FIG. 3 shows a detachable loudspeaker structure per Embodiment 2.

Referring to FIG. 3, the difference between this embodiment and Embodiment 1 is that the detachable component 3 further includes an L-shaped retaining plate 34 fixedly connected to the outer wall of the control box 1 near the clamping edge 30. The retaining plate 34 is disposed at a position where no screw 31 is disposed on the clamping edge 30. The clamping edge 30 is retained between the retaining plate 34 and the outer wall of the control box 1.

The operating principle of Embodiment 2 is: When the loudspeaker assembly 2 is damaged and needs to be replaced, the staff first screws the screws 31 to separate them from the built-in nuts 33, then removes the clamping edge 30 from between the retaining plate 34 and the control box 1. When installing a new loudspeaker assembly 2, first insert the clamping edge 30 between the retaining plate 34 and the control box 1, at this time the spring pins 41 abut against the metal contacts 43, then screw the screws 31 into the built-in nuts 33 to install the loudspeaker assembly 2 on the control box 1. The setting of the retaining plate 34 reduces the number of screws 31, further improving the convenience of replacing the loudspeaker assembly 2.

Embodiment 3

Figure 4:
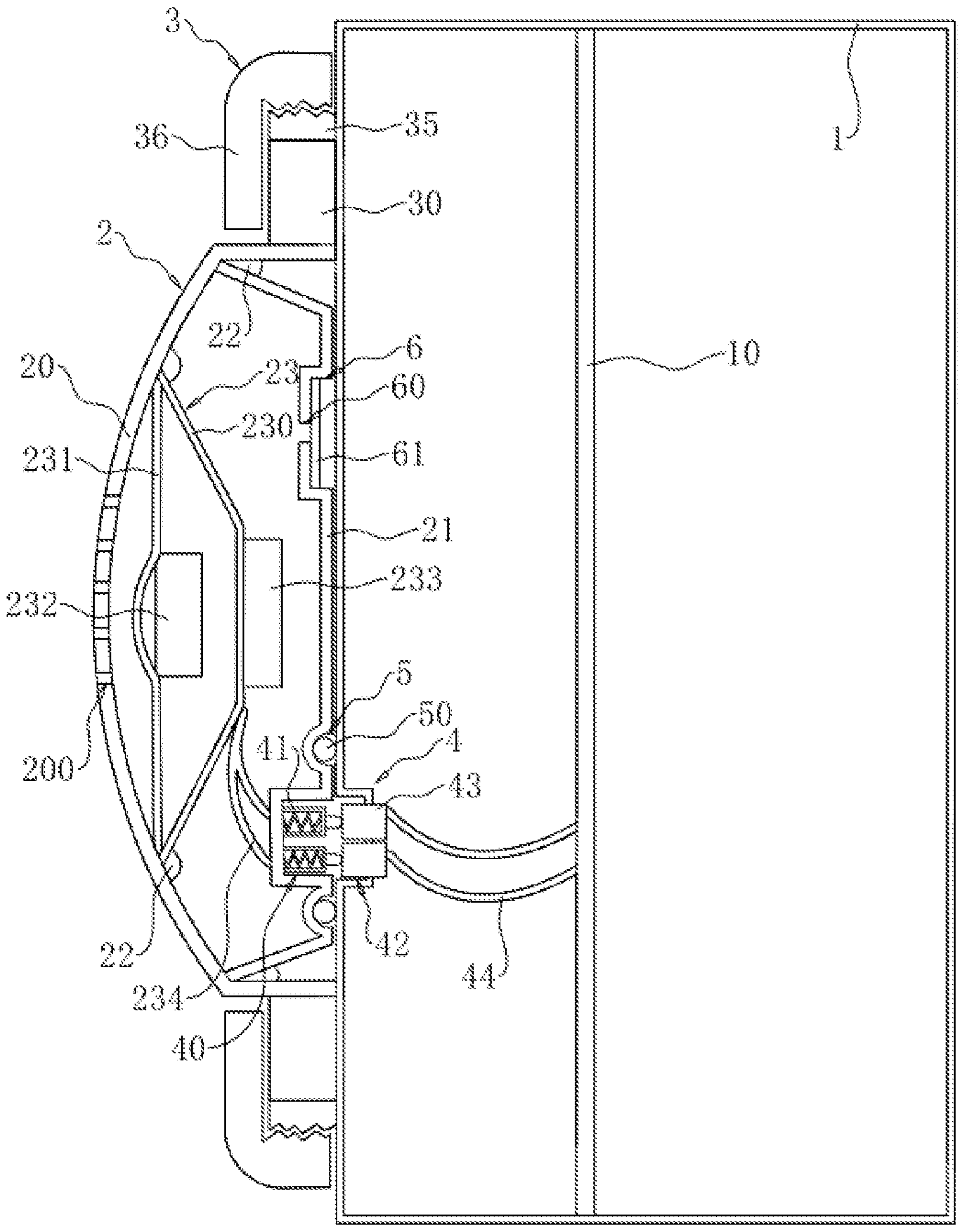
FIG. 4 shows a detachable loudspeaker structure per Embodiment 3.

Referring to FIG. 4, the difference between this embodiment and Embodiment 1 is that the detachable component 3 includes a clamping edge 30, a limiting ring 35 and a locking ring 36. The limiting ring 35 is fixedly connected to the outer wall of the control box 1 near the clamping edge 30. The clamping edge 30 is retained in the limiting ring 35. Threads are disposed on the outer peripheral wall of the limiting ring 35 and on the inner peripheral wall of the locking ring 36. The locking ring 36 is threadedly connected to the limiting ring 35 and presses the clamping edge 30 in place to prevent the clamping edge 30 from escaping the limiting ring 35.

The operating principle of Embodiment 3 is: When the loudspeaker assembly 2 is damaged and needs to be replaced, the staff can screw the locking ring 36 to separate it from the limiting ring 35, then take out the clamping edge 30 from the limiting ring 35.

When installing a new loudspeaker assembly 2, retaining the clamping edge 30 in the limiting ring 35 first, then screwing the locking ring 36 to thread it onto the limiting ring 35 and pressing the clamping edge 30 in place, thereby mounting the loudspeaker assembly 2 to the control box 1. No tools are required to replace the loudspeaker assembly 2 in this embodiment, which further improves the convenience of replacing the loudspeaker assembly 2.

Embodiment 4

Figure 5:
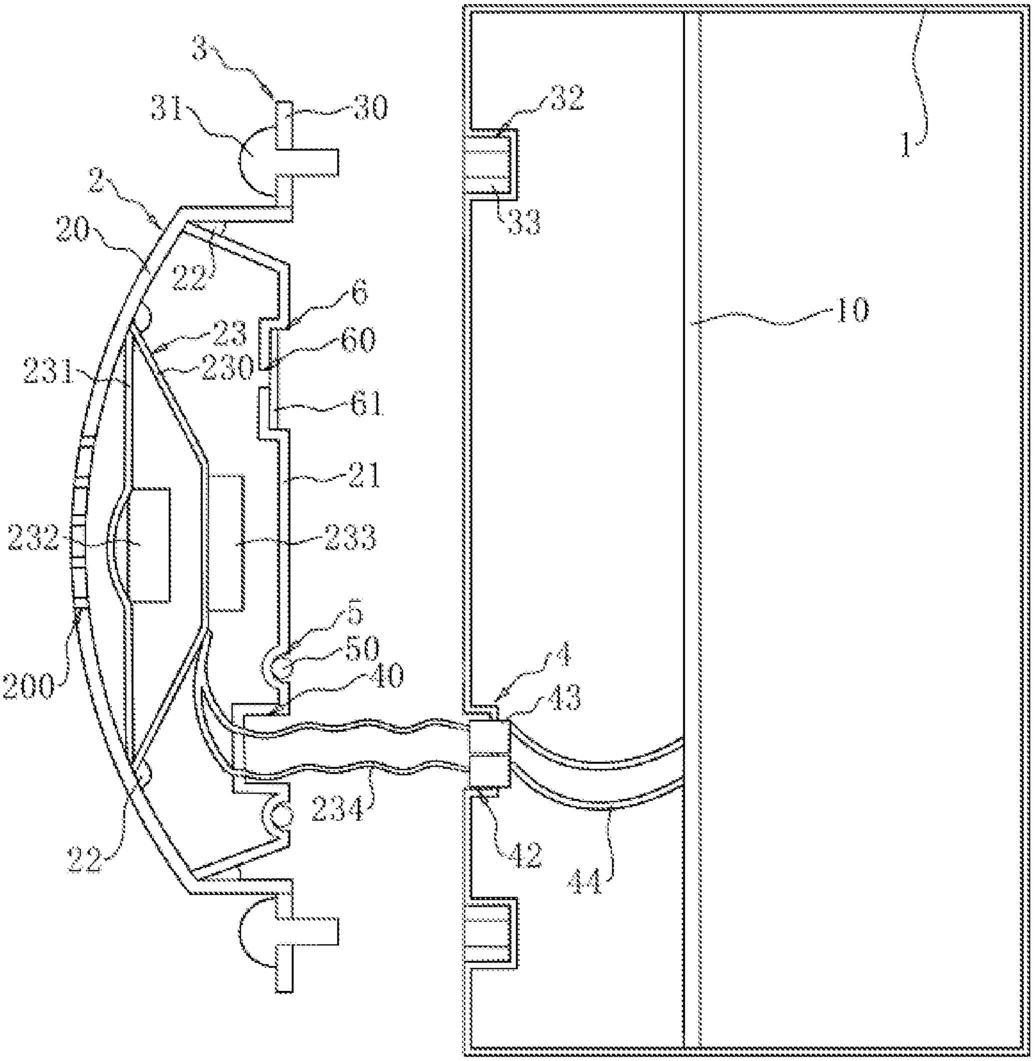
FIG. 5 shows a detachable loudspeaker structure per Embodiment 4.

Referring to FIG. 5, the difference between this embodiment and Embodiment 1 is that in the connecting component 4, the two terminal wires 234 penetrate through the inner protective shell 21 and extend out from the second mounting groove 40, and are welded to the two metal contacts 43 respectively.

The operating principle of Embodiment 4 is: Before installing the loudspeaker assembly 2, the terminal wires 234 need to be welded to the metal contacts 43 first, which greatly improves the connection reliability between the terminal wires 234 and the metal contacts 43.

The application also provides a metal detector including the detachable loudspeaker according to any one of the above embodiments, wherein the control box 1 is fixed on the metal detector. The metal detector of the application adopts all technical solutions of all embodiments of the above detachable loudspeaker. Therefore, it at least has all the beneficial effects brought by the technical solutions of the embodiments of the detachable loudspeaker, which will not be repeated here.

The above has described the application in further detail by means of specific embodiments. However, it should be understood that the above specific descriptions should not be construed as limiting the scope and essence of the application. All various modifications made by those skilled in the art after reading the specification would also fall within the scope of protection of the application.

The invention claimed is:

1. A detachable loudspeaker installed outside a control box (1), comprising: a loudspeaker assembly (2), the loudspeaker assembly (2) comprises an outer protective shell (20), an inner protective shell (21) and a dynamic loudspeaker (23), the outer protective shell (20) and the inner protective shell (21) form an accommodating cavity between them, the dynamic loudspeaker (23) is installed in the accommodating cavity, the inner protective shell (21) faces the control box (1), the control box (1) is provided with a PCB board (10), the dynamic loudspeaker (23) is electrically connected to the PCB board (10) through terminal wires (234), the outer protective shell (20) is provided with a detachable component (3) contacting the control box (1), the outer protective shell (20) is detachably fixed to the control box (1) through the detachable component (3).

2. The detachable loudspeaker according to claim 1, wherein the detachable component (3) comprises a clamping edge (30) disposed on the outer protective shell (20), the clamping edge (30) is vertically penetrated with a plurality of screws (31) spaced apart in circumferential direction, wall of the control box (1) near the inner protective shell (21) being recessed inward to form a plurality of first mounting grooves (32), the plurality of first mounting grooves (32) provided corresponding one-to-one to the plurality of screws (31), each of the first mounting grooves (32) is provided with a built-in nut (33), the screws (31) is threadedly connected to the built-in nuts (33).

3. The detachable loudspeaker according to claim 1, wherein the detachable component (3) comprises a clamping edge (30) disposed on the outer protective shell (20), a retaining plate (34) is disposed on the outer wall of the control box (1), part of the clamping edge (30) is retained by the retaining plate (34), the other part of the clamping edge (30) is fixed to the control box (1) through screws (31).

4. The detachable loudspeaker according to claim 1, wherein the detachable component (3) comprises a clamping edge (30), a limiting ring (35) and a locking ring (36), the clamping edge (30) is disposed on the outer protective shell (20), the limiting ring (35) is disposed on the outer wall of the control box (1) near the clamping edge (30), the clamping edge (30) is retained in the limiting ring (35), an outer peripheral wall of the limiting ring (35) is threaded, an inner peripheral wall of the locking ring (36) is also threaded, the locking ring (36) is threadedly connected to the limiting ring (35), the locking ring (36) also presses the clamping edge (30).

5. The detachable loudspeaker according to claim 1, wherein a connecting component (4) is disposed between the terminal wire (234) and the PCB board (10), the connecting component (4) comprises a second mounting groove (40) formed by the inner protective shell (21) recessing inward, a bottom surface of the second mounting groove (40) is provided with two spring pins (41), two terminal wires (234) are electrically connected to two spring pins (41) respectively, side wall of the control box (1) adjacent to the inner protective shell (21) being recessed inward to form a third mounting groove (42), the third mounting groove (42) disposed corresponding to the second mounting groove (40), bottom surface of the third mounting groove (42) is provided with two metal contacts (43), two spring pins (41) abut against two metal contacts (43) respectively, each metal contact (43) is connected with a connecting wire (44), two connecting wires (44) are electrically connected to the PCB board (10).

6. The detachable loudspeaker according to claim 1, wherein a connecting component (4) is disposed between the terminal wires (234) and the PCB board (10), the connecting component (4) comprises a second mounting groove (40) formed by the inner protective shell (21) recessing inward, side wall of the control box (1) adjacent to the inner protective shell (21) being recessed inward to form a third mounting groove (42), the third mounting groove (42) disposed corresponding to the second mounting groove (40), bottom surface of the third mounting groove (42) is provided with two metal contacts (43), each metal contact (43) is connected with a connecting wire (44), two connecting wires (44) being electrically connected to the PCB board (10), two terminal wires (234) penetrate the inner protective shell (21) and extend out from the second mounting groove (40), two terminal wires (234) being welded to two metal contacts (43) respectively.

7. The detachable loudspeaker according to claim 6, wherein the inner protective shell (21) is recessed inward to form an annular first receiving groove (5) surrounding the second mounting groove (40), groove wall of the first receiving groove (5) is provided with an annular waterproof ring (50), the waterproof ring (50) abuts against outer wall of the control box (1).

8. The detachable loudspeaker according to claim 1, wherein the inner protective shell (21) is recessed inward to form a second receiving groove (6), bottom surface of the second receiving groove (6) has a balancing hole (60) opened, bottom surface of the second receiving groove (6) is provided with a waterproof sound-transmitting membrane (61), the waterproof sound-transmitting membrane (61) covering the balancing hole (60).

9. The detachable loudspeaker according to claim 1, wherein the outer protective shell (20) and the inner protective shell (21) are coated with waterproof adhesive (22), the dynamic loudspeaker (23) and the outer protective shell (20) are also coated with waterproof adhesive (22).

10. A metal detector, comprising the detachable loudspeaker according to claim 1, wherein the control box (1) is fixed on the metal detector.

11. The metal detector according to claim 10, wherein the detachable component (3) comprises a clamping edge (30) disposed on the outer protective shell (20), the clamping edge (30) is vertically penetrated with a plurality of screws (31) spaced apart in circumferential direction, wall of the control box (1) near the inner protective shell (21) being recessed inward to form a plurality of first mounting grooves (32), the plurality of first mounting grooves (32) provided corresponding one-to-one to the plurality of screws (31), each of the first mounting grooves (32) is provided with a built-in nut (33), the screws (31) is threadedly connected to the built-in nuts (33).

12. The metal detector according to claim 10, wherein the detachable component (3) comprises a clamping edge (30) disposed on the outer protective shell (20), a retaining plate (34) is disposed on the outer wall of the control box (1), part of the clamping edge (30) is retained by the retaining plate (34), the other part of the clamping edge (30) is fixed to the control box (1) through screws (31).

13. The metal detector according to claim 10, wherein the detachable component (3) comprises a clamping edge (30), a limiting ring (35) and a locking ring (36), the clamping edge (30) is disposed on the outer protective shell (20), the limiting ring (35) is disposed on the outer wall of the control box (1) near the clamping edge (30), the clamping edge (30) is retained in the limiting ring (35), an outer peripheral wall of the limiting ring (35) is threaded, an inner peripheral wall of the locking ring (36) is also threaded, the locking ring (36) is threadedly connected to the limiting ring (35), the locking ring (36) also presses the clamping edge (30).

14. The metal detector according to claim 10, wherein a connecting component (4) is disposed between the terminal wire (234) and the PCB board (10), the connecting component (4) comprises a second mounting groove (40) formed by the inner protective shell (21) recessing inward, a bottom surface of the second mounting groove (40) is provided with two spring pins (41), two terminal wires (234) are electrically connected to two spring pins (41) respectively, side wall of the control box (1) adjacent to the inner protective shell (21) being recessed inward to form a third mounting groove (42), the third mounting groove (42) disposed corresponding to the second mounting groove (40), bottom surface of the third mounting groove (42) is provided with two metal contacts (43), two spring pins (41) abut against two metal contacts (43) respectively, each metal contact (43) is connected with a connecting wire (44), two connecting wires (44) are electrically connected to the PCB board (10).

15. The metal detector according to claim 10, wherein a connecting component (4) is disposed between the terminal wires (234) and the PCB board (10), the connecting component (4) comprises a second mounting groove (40) formed by the inner protective shell (21) recessing inward, side wall of the control box (1) adjacent to the inner protective shell (21) being recessed inward to form a third mounting groove (42), the third mounting groove (42) disposed corresponding to the second mounting groove (40), bottom surface of the third mounting groove (42) is provided with two metal contacts (43), each metal contact (43) is connected with a connecting wire (44), two connecting wires (44) being electrically connected to the PCB board (10), two terminal wires (234) penetrate the inner protective shell (21) and extend out from the second mounting groove (40), two terminal wires (234) being welded to two metal contacts (43) respectively.

16. The metal detector according to claim 15, wherein the inner protective shell (21) is recessed inward to form an annular first receiving groove (5) surrounding the second mounting groove (40), groove wall of the first receiving groove (5) is provided with an annular waterproof ring (50), the waterproof ring (50) abuts against outer wall of the control box (1).

17. The metal detector according to claim 10, wherein the inner protective shell (21) is recessed inward to form a second receiving groove (6), bottom surface of the second receiving groove (6) has a balancing hole (60) opened, bottom surface of the second receiving groove (6) is provided with a waterproof sound-transmitting membrane (61), the waterproof sound-transmitting membrane (61) covering the balancing hole (60).

18. The metal detector according to claim 10, wherein the outer protective shell (20) and the inner protective shell (21) are coated with waterproof adhesive (22), the dynamic loudspeaker (23) and the outer protective shell (20) are also coated with waterproof adhesive (22).

* * * * *